United States Patent
Nakano et al.

(10) Patent No.: US 9,293,600 B2
(45) Date of Patent: Mar. 22, 2016

(54) SEMICONDUCTOR ELEMENT, DISPLAY DEVICE, METHOD FOR MANUFACTURING SEMICONDUCTOR ELEMENT, AND METHOD FOR MANUFACTURING DISPLAY DEVICE

(71) Applicant: Kabushiki Kaisha Toshiba, Minato-ku (JP)

(72) Inventors: Shintaro Nakano, Kawasaki (JP); Tomomasa Ueda, Yokohama (JP); Kentaro Miura, Kawasaki (JP); Nobuyoshi Saito, Oota (JP); Tatsunori Sakano, Kawasaki (JP); Yuya Maeda, Kawasaki (JP); Masaki Atsuta, Yokosuka (JP); Hajime Yamaguchi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/461,677

(22) Filed: Aug. 18, 2014

(65) Prior Publication Data

US 2015/0084021 A1 Mar. 26, 2015

(30) Foreign Application Priority Data

Sep. 24, 2013 (JP) .................................. 2013-196709

(51) Int. Cl.
| | | |
|---|---|---|
| *H01L 29/08* | (2006.01) | |
| *H01L 29/786* | (2006.01) | |
| *H01L 29/66* | (2006.01) | |

(52) U.S. Cl.
CPC ...... *H01L 29/7869* (2013.01); *H01L 29/66969* (2013.01); *H01L 29/78618* (2013.01); *H01L 2227/323* (2013.01)

(58) Field of Classification Search
CPC ..................... G01L 29/7869; G01L 29/66742; G01L 27/3244; G01L 2227/32; G01L 51/56
See application file for complete search history.

(56) References Cited

U.S. PATENT DOCUMENTS

| | | | |
|---|---|---|---|
| 2010/0148171 A1* | 6/2010 | Hayashi et al. | ................. 257/43 |
| 2012/0178249 A1* | 7/2012 | Yamazaki | ..................... 438/479 |

(Continued)

FOREIGN PATENT DOCUMENTS

| | | | |
|---|---|---|---|
| JP | 2004-103957 A | 4/2004 | |
| JP | 2010/141230 A | 6/2010 | |
| JP | 2012/199530 A | 10/2012 | |

(Continued)

OTHER PUBLICATIONS

Office Action issued Oct. 16, 2015 in Taiwanese Patent Application No. 103128455 (with English language translation).

*Primary Examiner* — Shaun Campbell
(74) *Attorney, Agent, or Firm* — Oblon, McClelland, Maier & Neustadt, L.L.P.

(57) ABSTRACT

A semiconductor element includes a semiconductor layer, a first and a second conductive unit, a gate electrode, and a gate insulating film. The semiconductor layer includes a first portion, a second portion, and a third portion provided between the first portion and the second portion. The first conductive unit is electrically connected to the first portion. The second conductive unit is electrically connected to the second portion. The gate electrode is separated from the first conductive unit, the second conductive unit, and the third portion. The gate electrode opposes the third portion. The gate insulating film is provided between the third portion and the gate electrode. A concentration of nitrogen of the first portion is higher than a concentration of nitrogen of the third portion. A concentration of nitrogen of the second portion is higher than the concentration of nitrogen of the third portion.

17 Claims, 12 Drawing Sheets

(56) References Cited

U.S. PATENT DOCUMENTS

| | | |
|---|---|---|
| 2012/0225543 A1 | 9/2012 | Ohno et al. |
| 2012/0235137 A1* | 9/2012 | Koezuka et al. ............... 257/43 |
| 2013/0134418 A1 | 5/2013 | Hayashi et al. |
| 2014/0299874 A1* | 10/2014 | Yamazaki ....................... 257/43 |
| 2014/0346450 A1* | 11/2014 | Lee .................................. 257/40 |

FOREIGN PATENT DOCUMENTS

| | | |
|---|---|---|
| JP | 2012-212874 | 11/2012 |
| TW | 201227965 A1 | 7/2012 |
| TW | 201308201 A1 | 2/2013 |
| TW | 201316495 A1 | 4/2013 |
| WO | 94/00882 A1 | 1/1994 |

\* cited by examiner

SEMICONDUCTOR ELEMENT, DISPLAY DEVICE, METHOD FOR MANUFACTURING SEMICONDUCTOR ELEMENT, AND METHOD FOR MANUFACTURING DISPLAY DEVICE

CROSS-REFERENCE TO RELATED APPLICATIONS

This application is based upon and claims the benefit of priority from Japanese Patent Application No. 2013-196709, filed on Sep. 24, 2013; the entire contents of which are incorporated herein by reference.

FIELD

Embodiments described herein relate generally to a semiconductor element, a display device, a method for manufacturing semiconductor element, and a method for manufacturing display device.

BACKGROUND

There is known a semiconductor element in which the material of the semiconductor layer is an oxide semiconductor. There is known a display device based on the semiconductor element including an oxide semiconductor. Improvement in reliability is desired in such semiconductor elements and display devices.

DETAILED DESCRIPTION

Figure 1:
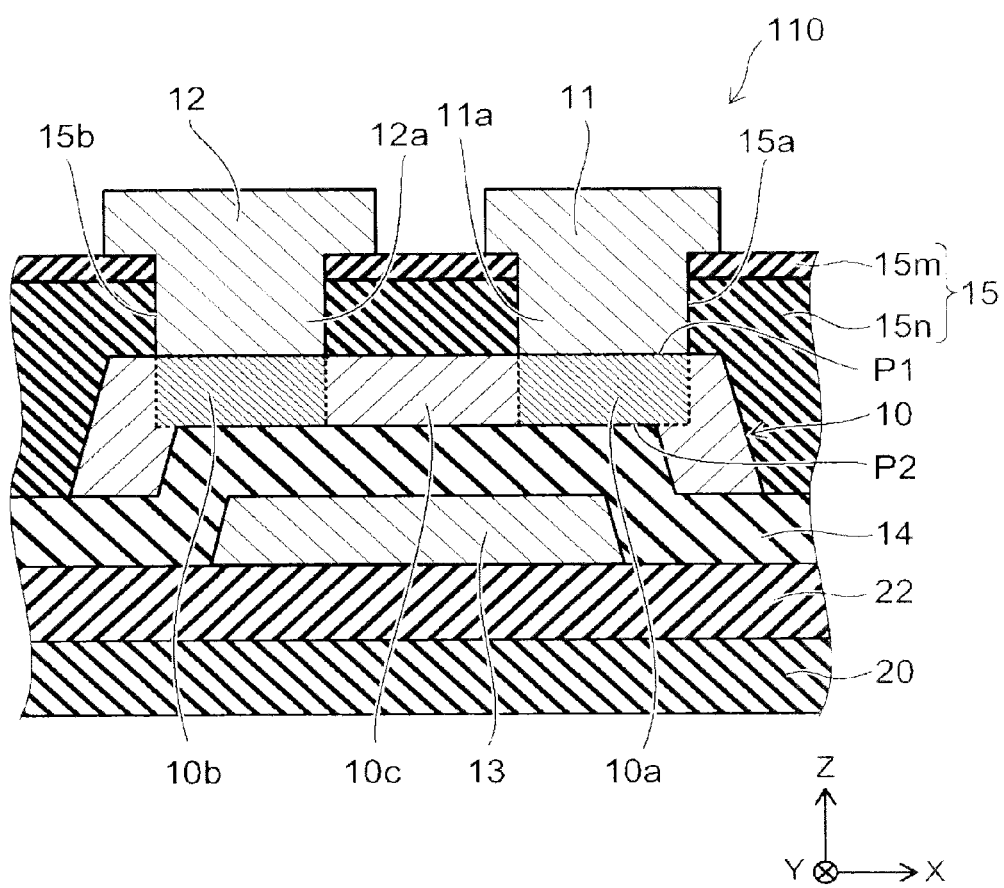
FIG. 1 is a sectional view schematically showing a semiconductor element according to a first embodiment.

According to one embodiment, a semiconductor element includes a semiconductor layer, a first conductive unit, a second conductive unit, a gate electrode, and a gate insulating film. The semiconductor layer includes a first portion, a second portion arranged with the first portion in a first direction, and a third portion provided between the first portion and the second portion. The semiconductor layer includes an oxide semiconductor. The first conductive unit is electrically connected to the first portion. The second conductive unit is separated from the first conductive unit and is electrically connected to the second portion. The gate electrode is separated from the first conductive unit, the second conductive unit, and the third portion. The gate electrode opposes the third portion. The gate insulating film is provided between the third portion and the gate electrode. A concentration of nitrogen of the first portion is higher than a concentration of nitrogen of the third portion. A concentration of nitrogen of the second portion is higher than the concentration of nitrogen of the third portion.

According to another embodiment, a display device includes a semiconductor element and a pixel unit. The semiconductor element includes a semiconductor layer, a first conductive unit, a second conductive unit, a gate electrode, and a gate insulating film. The semiconductor layer includes a first portion, a second portion arranged with the first portion in a first direction, and a third portion provided between the first portion and the second portion. The semiconductor layer includes an oxide semiconductor. The first conductive unit is electrically connected to the first portion. The second conductive unit is separated from the first conductive unit and is electrically connected to the second portion. The gate electrode is separated from the first conductive unit, the second conductive unit, and the third portion. The gate electrode opposes the third portion. The gate insulating film is provided between the third portion and the gate electrode. A concentration of nitrogen of the first portion is higher than a concentration of nitrogen of the third portion. A concentration of nitrogen of the second portion is higher than the concentration of nitrogen of the third portion. The pixel unit includes a first electrode electrically connected to the first conductive unit, a second electrode opposing the first electrode, and an organic light emitting layer provided between the first electrode and the second electrode. At least one of the first electrode and the second electrode has optical transmissivity.

According to another embodiment, a method is disclosed for manufacturing a semiconductor element. The method can include forming a gate electrode on a substrate. The method can include forming a gate insulating film on the gate electrode. The method can include forming a semiconductor layer on the gate insulating film. The semiconductor layer includes a first portion, a second portion arranged with the first portion in a first direction perpendicular to a stacking direction of the gate electrode and the gate insulating film, and a third portion provided between the first portion and the second portion. The semiconductor layer includes an oxide semiconductor. The third portion opposes the gate electrode. The method can include implanting nitrogen into the first portion and the second portion, making a concentration of nitrogen of the first portion being higher than a concentration of nitrogen of the third portion by the implanting nitrogen, and making a concentration of nitrogen of the second portion being higher than the concentration of nitrogen of the third portion by the implanting nitrogen. The method can include forming a first conductive unit electrically connected to the first portion. The method can include forming a second conductive unit separated from the first conductive unit and electrically connected to the second portion.

According to another embodiment, a method is disclosed for manufacturing a semiconductor element. The method can include forming a semiconductor layer on a substrate. The semiconductor layer includes a first portion, a second portion arranged with the first portion in a first direction, and a third portion provided between the first portion and the second portion. The semiconductor layer includes an oxide semiconductor. The method can include forming a gate insulating film on the third portion. The method can include forming a gate electrode on the gate insulating film. The method can include implanting nitrogen into the first portion and the second portion, making a concentration of nitrogen of the first portion being higher than a concentration of nitrogen of the third portion by the implanting nitrogen, and making a concentration of nitrogen of the second portion being higher than the concentration of nitrogen of the third portion by the implanting nitrogen. The method can include forming a first conductive unit electrically connected to the first portion. The method can include forming a second conductive unit separated from the first conductive unit and electrically connected to the second portion.

According to another embodiment, a method is disclosed for manufacturing a display device. The method can include forming a semiconductor element on a substrate. The method can include forming a gate electrode on the substrate. The method can include forming a gate insulating film on the gate electrode. The method can include forming a semiconductor layer on the gate insulating film. The semiconductor layer includes a first portion, a second portion arranged with the first portion in a first direction perpendicular to a stacking direction of the gate electrode and the gate insulating film, and a third portion provided between the first portion and the second portion. The semiconductor layer includes an oxide semiconductor. The third portion opposes the gate electrode. The method can include implanting nitrogen into the first portion and the second portion, making a concentration of nitrogen of the first portion being higher than a concentration of nitrogen of the third portion by the implanting nitrogen, and making a concentration of nitrogen of the second portion being higher than the concentration of nitrogen of the third portion by the implanting nitrogen. The method can include forming a first conductive unit electrically connected to the first portion. The method can include forming a second conductive unit separated from the first conductive unit and electrically connected to the second portion. The method can include forming a pixel unit on the substrate. The pixel unit includes a first electrode electrically connected to the first conductive unit, a second electrode opposing the first electrode, and an organic light emitting layer provided between the first electrode and the second electrode. At least one of the first electrode and the second electrode has optical transmissivity.

According to another embodiment, a method is disclosed for manufacturing a display device. The method can include forming a semiconductor element on a substrate. The method can include forming a semiconductor layer on the substrate. The semiconductor layer includes a first portion, a second portion arranged with the first portion in a first direction, and a third portion provided between the first portion and the second portion. The semiconductor layer includes an oxide semiconductor. The method can include forming a gate insulating film on the third portion. The method can include forming a gate electrode on the gate insulating film. The method can include implanting nitrogen into the first portion and the second portion, making a concentration of nitrogen of the first portion being higher than concentration of nitrogen of the third portion by the implanting nitrogen, and making a concentration of nitrogen of the second portion being higher than the concentration of nitrogen of the third portion by the implanting nitrogen. The method can include forming a first conductive unit electrically connected to the first portion. The method can include forming a second conductive unit separated from the first conductive unit and electrically connected to the second portion. The method can include forming a pixel unit on the substrate. The pixel unit includes a first electrode electrically connected to the first conductive unit, a second electrode opposing the first electrode, and an organic light emitting layer provided between the first electrode and the second electrode. At least one of the first electrode and the second electrode has optical transmissivity.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present description and the drawings, components similar to those described previously with reference to earlier figures are labeled with like reference numerals, and the detailed description thereof is omitted appropriately.

(First Embodiment)

FIG. 1 is a sectional view schematically showing a semiconductor element according to a first embodiment.

Figure 2:
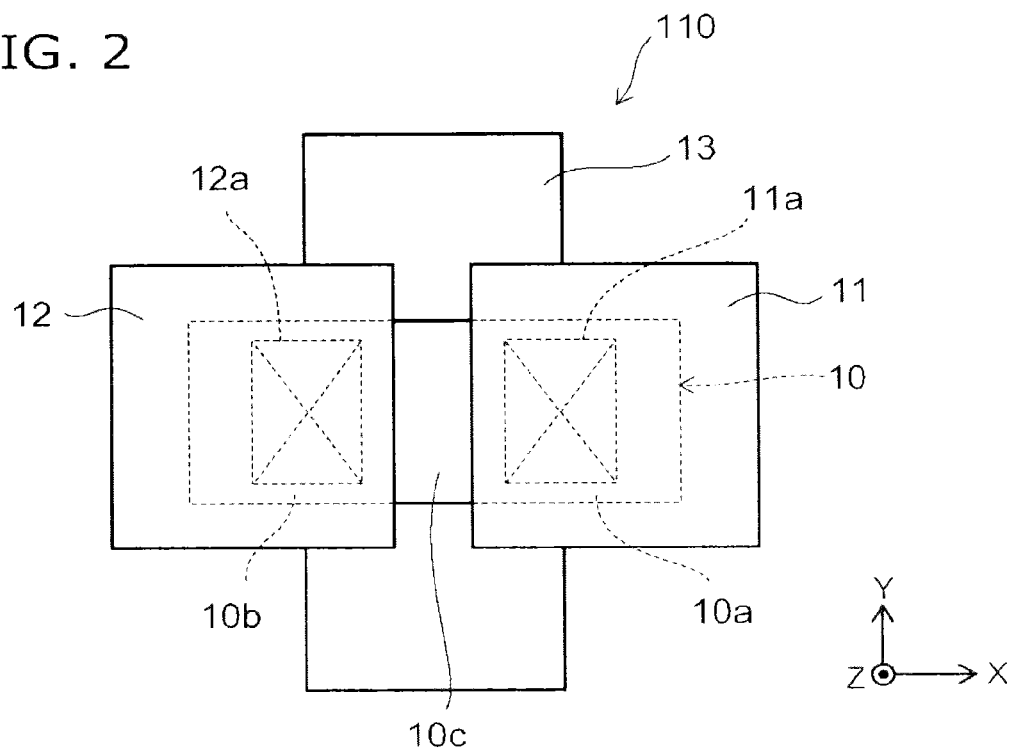
FIG. 2 is a plan view schematically showing part of the semiconductor element according to the first embodiment.

FIG. 2 is a plan view schematically showing part of the semiconductor element according to the first embodiment.

As shown in FIGS. 1 and 2, the semiconductor element 110 includes a semiconductor layer 10, a first conductive unit 11, a second conductive unit 12, a gate electrode 13, and a gate insulating film 14. The semiconductor element 110 is e.g. a thin film transistor.

The semiconductor layer 10 includes a first portion 10a, a second portion 10b arranged with the first portion 10a in a first direction, and a third portion 10c provided between the first portion 10a and the second portion 10b.

The semiconductor layer 10 includes an oxide semiconductor. The semiconductor layer 10 includes e.g. an oxide semiconductor including at least one of indium (In), gallium (Ga), zinc (Zn), and tin (Sn). The semiconductor layer 10 is made of e.g. an oxide semiconductor including In, Ga, and Zn (i.e., In—Ga—Zn—O oxide semiconductor). The semiconductor layer 10 may be made of e.g. an oxide semiconductor including In and Zn (i.e., In—Zn—O oxide semiconductor). The semiconductor layer 10 may be made of e.g. an oxide film including In, Zn, and Si (i.e., In—Zn—Si—O oxide semiconductor).

The first conductive unit 11 is electrically connected to the first portion 10a. The second conductive unit 12 is separated from the first conductive unit 11 and electrically connected to the second portion 10b. For instance, one of the first conductive unit 11 and the second conductive unit 12 is a drain, and the other is a source. The first conductive unit 11 and the second conductive unit 12 are made of e.g. Mo, Ti, Al, ITO, IZO, TiN, Mo$_2$N, and TaN. The first conductive unit 11 and the second conductive unit 12 may be made of e.g. a stacked film of these materials.

The gate electrode 13 is separated from the first conductive unit 11, the second conductive unit 12 and the third portion 10c. The gate electrode 13 opposes the third portion 10c. The gate electrode 13 is made of e.g. a high melting point metal such as molybdenum tungsten (MoW), molybdenum tantalum (MoTa), and tungsten (W). Alternatively, the material of the gate electrode 13 may be an Al alloy composed primarily of Al with countermeasures against hillocks, or Cu having lower resistance.

The gate insulating film 14 is provided between the third portion 10c and the gate electrode 13. The gate insulating film 14 is made of e.g. at least one of silicon oxide film (e.g., $SiO_2$), silicon nitride film (e.g., $SiN_x$), and silicon oxynitride film (SiON).

In this example, the semiconductor element 110 further includes an interlayer insulating film 15, a substrate 20, and a barrier layer 22. The interlayer insulating film 15, the substrate 20, and the barrier layer 22 are provided as necessary, and can be omitted.

The interlayer insulating film 15 is provided between the semiconductor layer 10 and the first conductive unit 11 and between the semiconductor layer 10 and the second conductive unit 12. The interlayer insulating film 15 has insulating property. The interlayer insulating film 15 is made of e.g. at least one of silicon oxide film, silicon nitride film, and silicon oxynitride film.

The interlayer insulating film 15 includes a first opening 15a for exposing at least part of the first portion 10a and a second opening 15b for exposing at least part of the second portion 10b.

The first conductive unit 11 is electrically connected to at least part of the first portion 10a exposed by the first opening 15a. Part 11a of the first conductive unit 11 is inserted into the first opening 15a. The part 11a of the first conductive unit 11 is e.g. in contact with the first portion 10a in the first opening 15a. Thus, the first conductive unit 11 is electrically connected to the first portion 10a.

The second conductive unit 12 is electrically connected to at least part of the second portion 10b exposed by the second opening 15b. Part 12a of the second conductive unit 12 is inserted into the second opening 15b. The part 12a of the second conductive unit 12 is e.g. in contact with the second portion 10b in the second opening 15b. Thus, the second conductive unit 12 is electrically connected to the second portion 10b.

The part 11a of the first conductive unit 11 and the part 12a of the second conductive unit 12 are what is called contact holes. The part 11a may be integrally formed from the same material as the portion of the first conductive unit 11 outside the first opening 15a, or may be formed from a material different from that of the outside portion. The part 12a may be integrally formed from the same material as the portion of the second conductive unit 12 outside the second opening 15b, or may be formed from a material different from that of the outside portion.

The barrier layer 22 is provided on the substrate 20. The substrate 20 is e.g. a glass substrate or semiconductor substrate. The substrate 20 may be made of a resin material such as polyimide. The barrier layer 22 suppresses e.g. penetration of moisture and impurities from the substrate 20 side. The barrier layer 22 protects e.g. the semiconductor layer 10 from moisture and the like. The barrier layer 22 is made of e.g. silicon oxide film, silicon nitride film, or silicon oxynitride film.

In this example, the gate electrode 13 is provided on the barrier layer 22. The gate insulating film 14 is provided on the gate electrode 13. The semiconductor layer 10 is provided on the gate insulating film 14. The first conductive unit 11 is provided on the first portion 10a. The second conductive unit 12 is provided on the second portion 10b. That is, in this example, the semiconductor element 110 is a thin film transistor of the bottom gate type. In this example, the interlayer insulating film 15 is provided on the semiconductor layer 10. The first conductive unit 11 and the second conductive unit 12 are provided on the interlayer insulating film 15.

Here, the direction parallel to the stacking direction of the gate electrode 13 and the gate insulating film 14 is referred to as Z-axis direction. One direction perpendicular to the Z-axis direction is referred to as X-axis direction. The direction perpendicular to the X-axis direction and the Z-axis direction is referred to as Y-axis direction. In this example, the second portion 10b is arranged with the first portion 10a in the X-axis direction. The arranging direction of the second portion 10b is not limited to the X-axis direction, but may be an arbitrary direction perpendicular to the Z-axis direction.

In the semiconductor layer 10 of the semiconductor element 110, the concentration of nitrogen of the first portion 10a is higher than the concentration of nitrogen of the third portion 10c. Furthermore, the concentration of nitrogen of the second portion 10b is higher than the concentration of nitrogen of the third portion 10c. For instance, the third portion 10c does not substantially contain nitrogen. The first portion 10a and the second portion 10b are made of e.g. In—Ga—Zn—O—N film. The third portion 10c is made of e.g. In—Ga—Zn—O film. The first portion 10a and the second portion 10b include nitrogen.

The composition ratio of nitrogen in the first portion 10a is e.g. more than 0 atomic % and 3 atomic % or less. The composition ratio of nitrogen in the second portion 10b is e.g. more than 0 atomic % and 3 atomic % or less.

The concentration of nitrogen of the semiconductor layer can be measured by e.g. energy dispersive X-ray spectroscopy (EDX) or wave dispersive X-ray spectroscopy. For instance, in wave dispersive X-ray spectroscopy, measurement is performed under the condition of quantitative analysis. Thus, for instance, the concentration of nitrogen of the semiconductor layer 10 can be measured with higher accuracy.

Thus, in the semiconductor layer 10, the resistivity of the first portion 10a is made higher than the resistivity of the third portion 10c. The resistivity of the second portion 10b is made higher than the resistivity of the third portion 10c. The resistivity of the first portion 10a is e.g. 10 Ω·cm or more and $10^8$ Ω·cm or less. The resistivity of the second portion 10b is e.g. 10 Ω·cm or more and $10^8$ Ω·cm or less. The resistivity of the third portion 10c is e.g. $10^{-4}$ Ω·cm or more and 100 Ω·cm or less.

Figure 3:
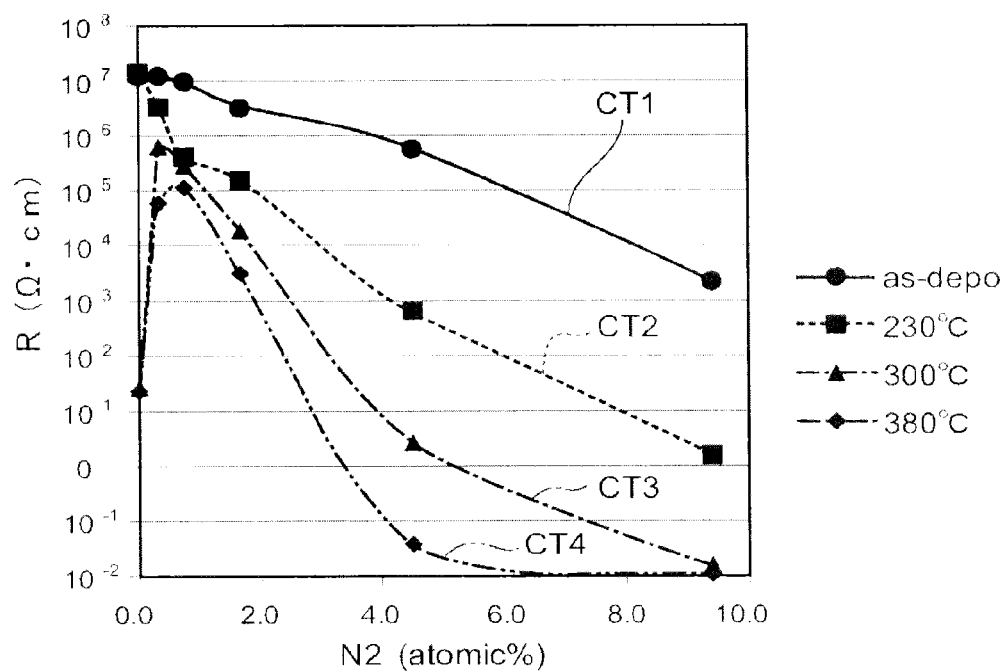
FIG. 3 is a graph showing an example of the characteristics of the semiconductor element according to the first embodiment.

FIG. 3 is a graph showing an example of the characteristics of the semiconductor element according to the first embodiment.

In FIG. 3, the horizontal axis represents the nitrogen composition ratio $N_2$ (atomic %) of the semiconductor layer 10, and the vertical axis represents the resistivity R (Ω·cm) of the semiconductor layer 10. FIG. 3 shows the relationship between the nitrogen concentration and the resistivity of the semiconductor layer 10 subjected to heat treatment. In the process for manufacturing the semiconductor element 110, heat treatment is performed at approximately 200-400° C. This can enhance the uniformity and stability of the semiconductor layer 10.

In FIG. 3, the first characteristic CT1 is an example of the characteristics of the semiconductor layer 10 before heat treatment. The second characteristic CT2 is an example of the characteristics of the semiconductor layer 10 after heat treatment at 230° C. The third characteristic CT3 is an example of the characteristics of the semiconductor layer 10 after heat treatment at 300° C. The fourth characteristic CT4 is an example of the characteristics of the semiconductor layer 10 after heat treatment at 380° C.

As shown in FIG. 3, in the first characteristic CT1 and the second characteristic CT2, the resistivity decreases with the increase of the composition ratio of nitrogen. On the other hand, in the third characteristic CT3 and the fourth characteristic CT4, when the composition ratio of nitrogen is increased from the state containing substantially no nitrogen, the resistivity once increases, and then decreases. For instance, in the fourth characteristic CT4, the resistivity is maximized when the composition ratio of nitrogen is set to approximately 1 atomic %. Furthermore, in the fourth characteristic CT4, when the composition ratio of nitrogen is made higher than 3 atomic %, the resistivity is made lower than that for 0 atomic %.

Thus, in the case where heat treatment at 300° C. or more is performed on the semiconductor layer 10, the composition ratio of nitrogen of the first portion 10a and the second portion 10b is set to more than 0 atomic % and lower than 3 atomic %. Accordingly, the resistivity of the first portion 10a and the second portion 10b is made higher than the resistivity of the third portion 10c. For instance, the resistivity of the first portion 10a and the second portion 10b can be set to 10 Ω·cm or more.

In this example, the first portion 10a is provided to extend along the Z-axis direction of the semiconductor layer 10. Likewise, the second portion 10b is provided to extend along the Z-axis direction of the semiconductor layer 10. For example, the first portion 10a is provided entirely in the Z-axis direction of the semiconductor layer 10. Likewise, the second portion 10b is provided entirely in the Z-axis direction of the semiconductor layer 10.

The semiconductor layer 10 includes a first surface P1 and a second surface P2. The first surface P1 is e.g. a surface opposing each of the first conductive unit 11 and the second conductive unit 12. The semiconductor layer 10 is e.g. in contact with the first conductive unit 11 and the second conductive unit 12 at the first surface P1. The second surface P2 is a surface on the opposite side from the first surface P1.

The first portion 10a is provided e.g. continuously from the first surface P1 to the second surface P2 in the Z-axis direction. The second portion 10b is provided e.g. continuously from the first surface P1 to the second surface P2 in the Z-axis direction. For instance, in the first portion 10a and the second portion 10b, the concentration of nitrogen on the first surface P1 side is higher than the concentration of nitrogen on the second surface P2 side. Thus, the first portion 10a and the second portion 10b may have a varying profile of nitrogen concentration. The concentration of nitrogen of each of the first portion 10a and the second portion 10b may be substantially constant.

The thickness (length in the Z-axis direction) of the semiconductor layer 10 is e.g. 5 nm or more and 100 nm or less. More preferably, the thickness of the semiconductor layer 10 is e.g. 10 nm or more and 30 nm or less.

In the semiconductor element 110, the interlayer insulating film 15 includes a first region 15m and a second region 15n. The second region 15n is provided between the semiconductor layer 10 and the first region 15m. The concentration of nitrogen of the first region 15m is higher than the concentration of nitrogen of the second region 15n. The first region 15m is made of e.g. silicon oxide film ($SiO_2$). The second region 15n is made of e.g. silicon oxynitride film (SiON). This can enhance e.g. the barrier property of the interlayer insulating film 15. For instance, penetration of moisture from the side of the first conductive unit 11 and the second conductive unit 12 can be suppressed. For instance, the semiconductor layer 10 and the like can be protected from moisture and the like.

As shown in FIG. 2, in this example, the semiconductor layer 10 is placed across the gate electrode 13. In this example, both ends in the X-axis direction of the semiconductor layer 10 do not overlap the gate electrode 13 as projected on the X-Y plane (the plane perpendicular to the stacking direction). Furthermore, in this example, the part 11a of the first conductive unit 11 includes a portion overlapping the gate electrode 13 and a portion not overlapping the gate electrode 13 as projected on the X-Y plane. Likewise, the part 12a of the second conductive unit 12 includes a portion overlapping the gate electrode 13 and a portion not overlapping the gate electrode 13 as projected on the X-Y plane.

Thin film transistors are widely used in e.g. liquid crystal display devices and organic electroluminescence (EL) display devices. Oxide semiconductors are drawing attention as the material of the semiconductor layer of such thin film transistors.

Among them, the thin film transistor based on an amorphous oxide semiconductor such as In—Ga—Zn—O film is drawing attention. This oxide semiconductor can be formed substantially uniformly in a large area at room temperature by sputtering technique. Furthermore, a thin film transistor having high reliability and high uniformity can be formed at a relatively low process temperature such as 300-400° C. Moreover, a high mobility characteristic such as a field effect mobility of approximately 10 times that of amorphous silicon is obtained. However, in the case of forming a thin film transistor based on the aforementioned oxide semiconductor, there are problems of thermal stability and stability under light irradiation.

In the thin film transistor in which the semiconductor layer is made of oxide semiconductor, heat treatment at 200-400° C. is performed to improve uniformity and stability. However, under heat treatment at 300° C. or more, redox reaction occurs at the interface between the electrode and the oxide semiconductor. Thus, oxygen is extracted into the electrode. For instance, a large amount of oxygen deficiency occurs near the electrode in the oxide semiconductor. For instance, the threshold voltage decreases if the oxygen deficient region produced by heat treatment is irradiated with short wavelength light.

In contrast, in the semiconductor element 110 according to this embodiment, in the semiconductor layer 10, the concentration of nitrogen of the first portion 10a electrically connected to the first conductive unit 11 and the concentration of nitrogen of the second portion 10b electrically connected to the second conductive unit 12 are made higher than the concentration of nitrogen of the third portion 10c.

Thus, in the semiconductor element 110 according to this embodiment, extraction of oxygen near the first conductive unit 11 of the semiconductor layer 10 can be suppressed. Extraction of oxygen near the second conductive unit 12 of the semiconductor layer 10 can be suppressed. That is, extraction of oxygen in the first portion 10a and the second portion 10b can be suppressed. Accordingly, in the semiconductor element 110, for instance, variation of the threshold voltage due to heat and light can be suppressed. Thus, high reliability can be achieved in the semiconductor element 110 according to this embodiment.

Furthermore, as described with reference to FIG. 3, the composition ratio of nitrogen in the first portion 10a and the second portion 10b is set to more than 0 atomic % and 3 atomic % or less. Thus, the resistivity of the first portion 10a and the second portion 10b is made higher than the resistivity of the third portion 10c. This can suppress more appropriately the variation of the threshold voltage due to heat and light.

Next, a method for manufacturing the semiconductor element 110 is described.

FIGS. 4A to 4G are sectional views schematically showing a sequential process for manufacturing a semiconductor element according to the first embodiment.

Figure 4A:
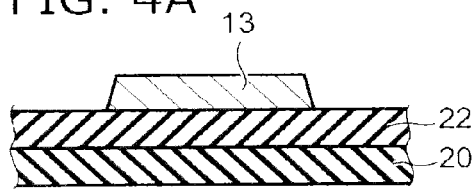
FIGS. 4A to 4G are sectional views schematically showing a sequential process for manufacturing a semiconductor element according to the first embodiment.

As shown in FIG. 4A, in the manufacturing of the semiconductor element 110, first, a barrier layer 22 is formed on a substrate 20, and a gate electrode 13 is formed on the barrier layer 22.

Figure 4B:
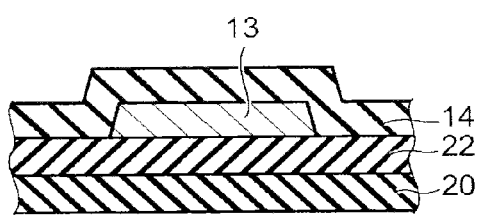

As shown in FIG. 4B, a gate insulating film 14 is formed on the gate electrode 13. The gate insulating film 14 is made of e.g. $SiN_x$ film. For instance, the gate insulating film 14 may be configured in a stacked structure by stacking $SiO_x$ film or at least one of high-k films such as $AlO_x$ film, $TaO_x$ film, $HfO_x$ film, and $TiO_x$ film on the $SiN_x$ film.

Figure 4C:
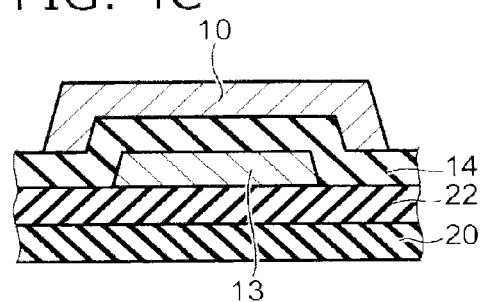

As shown in FIG. 4C, a semiconductor layer 10 is formed on the gate insulating film 14. The semiconductor layer 10 including oxide semiconductor is formed by e.g. reactive sputtering technique. The film formation atmosphere for sputtering is e.g. a mixed atmosphere of argon and oxygen. For instance, the carrier density of the oxide semiconductor can be controlled by the ratio of argon and oxygen. The method for forming the semiconductor layer 10 is not limited to reactive sputtering technique, but can be any of various thin film formation techniques such as PLD technique, reactive sputtering technique, CVD technique, and spin coating technique. The semiconductor layer 10 has e.g. an oxidation structure and polycrystalline structure. Various thin film structures of the semiconductor layer 10 can be observed and confirmed by e.g. high power TEM.

Figure 4D:
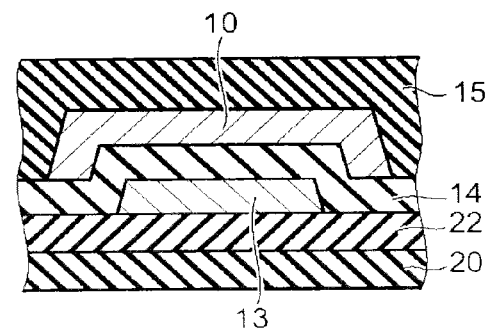

As shown in FIG. 4D, an interlayer insulating film 15 functioning as a protective film is formed on the semiconductor layer 10. The interlayer insulating film 15 is made of e.g. $SiO_x$ film. The interlayer insulating film 15 is formed by e.g. PECVD technique. The film formation atmosphere for PECVD technique is e.g. a mixed atmosphere of silane and dinitrogen monoxide. The interlayer insulating film 15 may be formed from e.g. tetraethyl orthosilicate (TEOS).

Next, heat treatment is performed in a clean oven or quartz furnace. The temperature of the heat treatment is e.g. 200-400° C., and preferably 350-400° C. The heat treatment is performed in an ambient and nitrogen atmosphere.

Figure 4E:
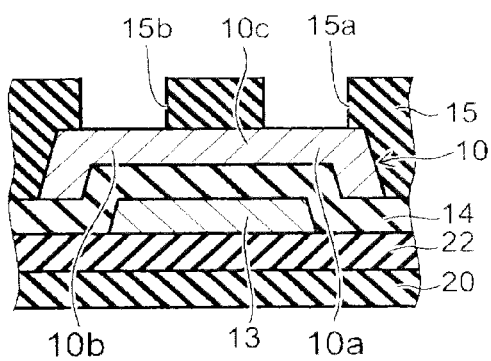

As shown in FIG. 4E, a first opening 15a and a second opening 15b are formed in the interlayer insulating film 15 by e.g. photolithography processing and etching processing. That is, at least part of the first portion 10a of the semiconductor layer 10 is exposed by the first opening 15a, and at least part of the second portion 10b of the semiconductor layer 10 is exposed by the second opening 15b. The first opening 15a and the second opening 15b are formed by e.g. reactive ion etching. The atmosphere for etching is made of e.g. carbon tetrafluoride.

Figure 4F:
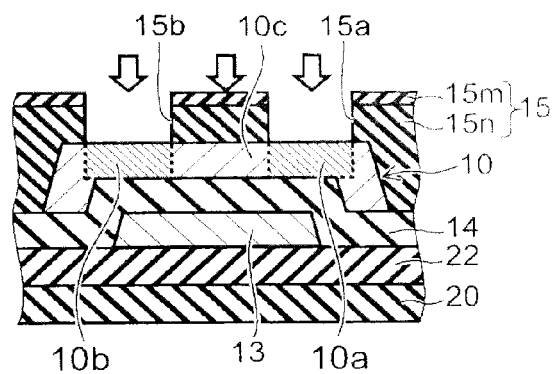

As shown in FIG. 4F, nitrogen is implanted from above the interlayer insulating film 15. Thus, nitrogen is implanted into the first portion 10a of the semiconductor layer 10 in accordance with the shape of the first opening 15a. Nitrogen is implanted into the second portion 10b of the semiconductor layer 10 in accordance with the shape of the second opening 15b. Thus, the concentration of nitrogen of the first portion 10a and the concentration of nitrogen of the second portion 10b are made higher than the concentration of nitrogen of the third portion 10c.

Furthermore, nitrogen is implanted also into the upper portion of the interlayer insulating film 15. Thus, a first region 15m and a second region 15n are formed in the interlayer insulating film 15. The concentration of nitrogen of the first region 15m is made higher than the concentration of nitrogen of the second region 15n.

Thus, in the implantation of nitrogen, for instance, the interlayer insulating film 15 is used as a mask. This can simplify the manufacturing process compared with the case of e.g. separately preparing a dedicated mask. Furthermore, the first region 15m is formed in the interlayer insulating film 15. This can enhance e.g. the barrier property of the interlayer insulating film 15.

Figure 4G:
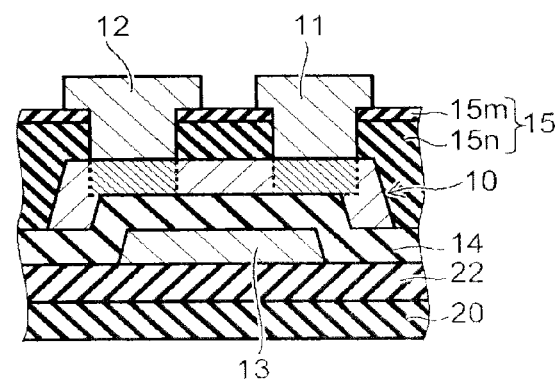

As shown in FIG. 4G, a first conductive unit 11 and a second conductive unit 12 constituting a source electrode and a drain electrode are formed on the interlayer insulating film 15. In forming the first conductive unit 11 and the second conductive unit 12, for instance, a metal film is formed on the interlayer insulating film 15 by magnetron sputtering technique or the like. The metal film is made of e.g. Mo, Ti, Al, ITO, IZO, TiN, or TaN. The metal film may be e.g. a stacked film of these materials. Subsequently, the metal film is patterned by e.g. inductively coupled reactive ion etching. Thus, the first conductive unit 11 and the second conductive unit 12 are formed.

Next, heat treatment is performed in a clean oven or quartz furnace. The temperature of the heat treatment is e.g. 200-400° C., and preferably 250-350° C. The heat treatment is performed in an ambient and nitrogen atmosphere.

Thus, the semiconductor element 110 is completed.

Figure 5:
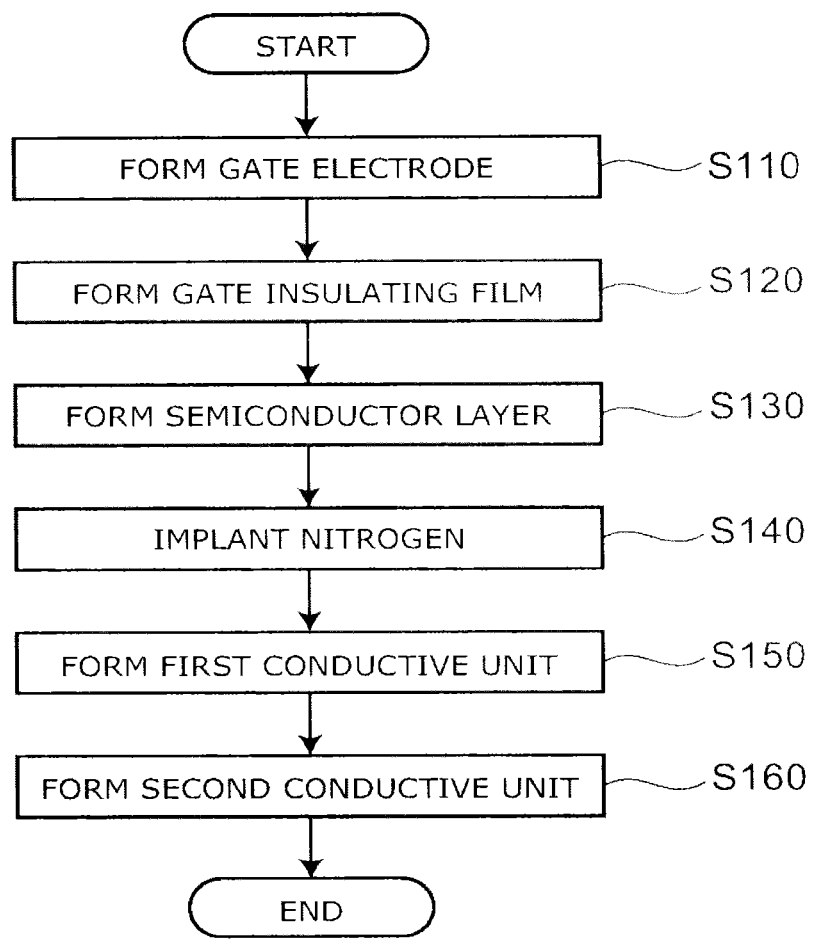
FIG. 5 is a flow chart schematically showing the method for manufacturing a semiconductor element according to the first embodiment.

FIG. 5 is a flow chart schematically showing the method for manufacturing a semiconductor element according to the first embodiment.

As shown in FIG. 5, the method for manufacturing a semiconductor element according to the embodiment includes a step S110 for forming a gate electrode 13, a step S120 for forming a gate insulating film 14, a step S130 for forming a semiconductor layer 10, a step S140 for implanting nitrogen, a step S150 for forming a first conductive unit 11, and a step S160 for forming a second conductive unit 12. The method for manufacturing a semiconductor element according to the embodiment may further include other steps. For instance, a step for forming an interlayer insulating film 15 may be provided between the step S130 and the step S140.

The step S110 performs e.g. the processing described with reference to FIG. 4A. The step S120 performs e.g. the processing described with reference to FIG. 4B. The step S130 performs e.g. the processing described with reference to FIG. 4C. The step S140 performs e.g. the processing described with reference to FIGS. 4D to 4F. The step S150 and the step S160 perform e.g. the processing described with reference to FIG. 4G.

Thus, a semiconductor element having high reliability can be manufactured.

Figure 6:
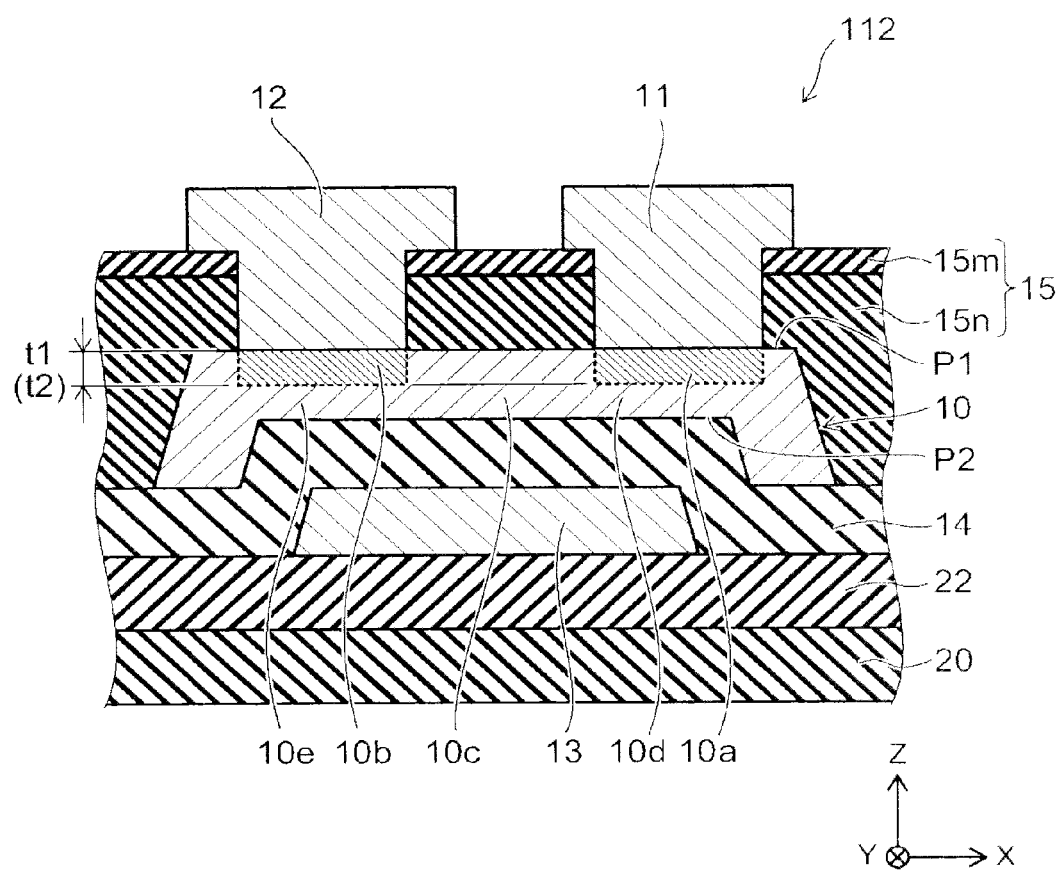
FIG. 6 is a sectional view schematically showing an alternative semiconductor element according to the first embodiment.

FIG. 6 is a sectional view schematically showing an alternative semiconductor element according to the first embodiment.

As shown in FIG. 6, in the semiconductor element 112, the semiconductor layer 10 further includes a fourth portion 10d and a fifth portion 10e. In this example, the first portion 10a is provided between the first conductive unit 11 and the fourth portion 10d. The second portion 10b is provided between the second conductive unit 12 and the fifth portion 10e.

The concentration of nitrogen of the first portion 10a is higher than the concentration of nitrogen of the fourth portion 10d. The concentration of nitrogen of the second portion 10b is higher than the concentration of nitrogen of the fifth portion 10e. For instance, the fourth portion 10d and the fifth portion 10e do not substantially contain nitrogen. The concentration of nitrogen of the fourth portion 10d and the fifth portion 10e is e.g. substantially equal to the concentration of nitrogen of the third portion 10c. The fourth portion 10d and the fifth portion 10e are made of e.g. silicon oxide film.

That is, in the semiconductor element 112, portions of the semiconductor layer 10 with high concentration of nitrogen (first portion 10a and second portion 10b) are provided in part of the semiconductor layer 10 in the Z-axis direction. Thus, the first portion 10a and the second portion 10b do not need to be provided entirely in the Z-axis direction of the semiconductor layer 10. The first portion 10a and the second portion 10b only need to be provided at least near the first surface P1. That is, the first portion 10a and the second portion 10b only need to be provided at least in part of the respective portions of the semiconductor layer 10 opposing the first conductive unit 11 and the second conductive unit 12 (respective portions in contact with the first conductive unit 11 and the second conductive unit 12).

In the semiconductor element 112, each of the thickness t1 of the first portion 10a and the thickness t2 of the second portion 10b is e.g. more than 0 and 5 nm or less. This can suppress e.g. the resistance of the semiconductor layer 10.

On the other hand, in the semiconductor element 110, the first portion 10a and the second portion 10b are provided entirely in the Z-axis direction of the semiconductor layer 10. In this case, for instance, oxygen deficiency near the first conductive unit 11 and near the second conductive unit 12 of the semiconductor layer 10 can be suppressed more appropriately.

Figure 7A:
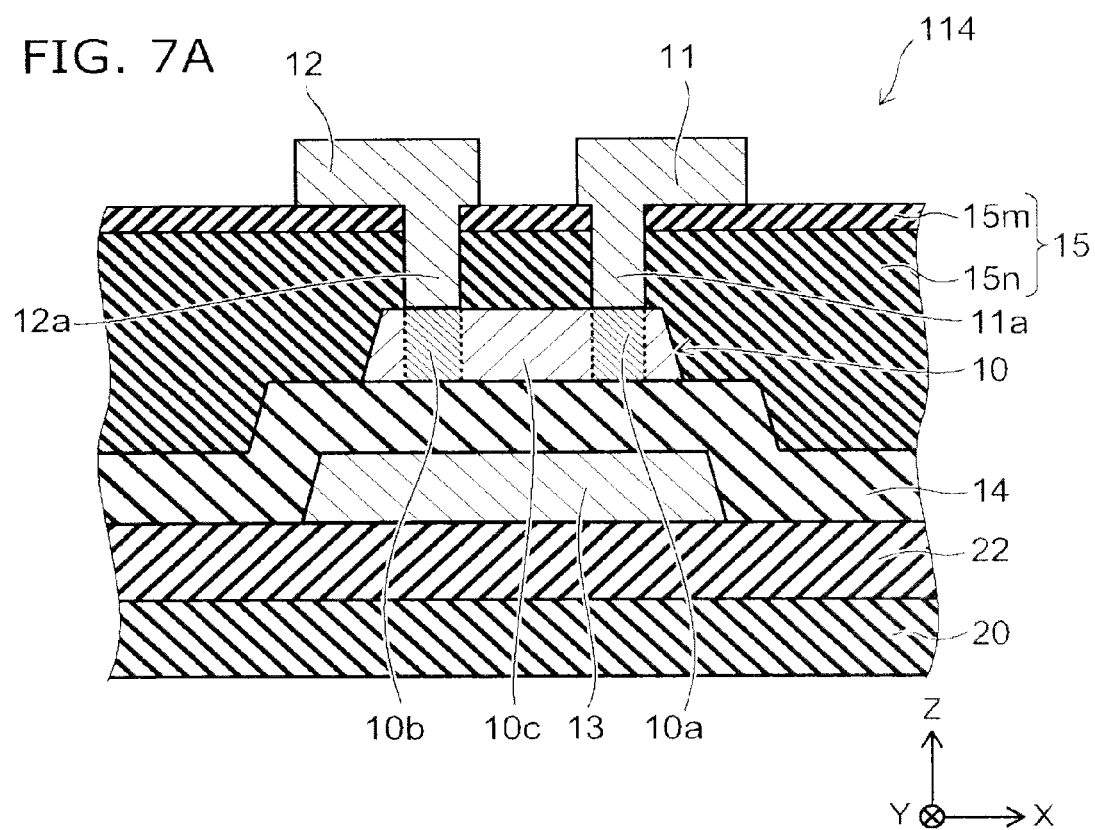
FIGS. 7A and 7B are schematic views showing an alternative semiconductor element according to the first embodiment.
Figure 7B:
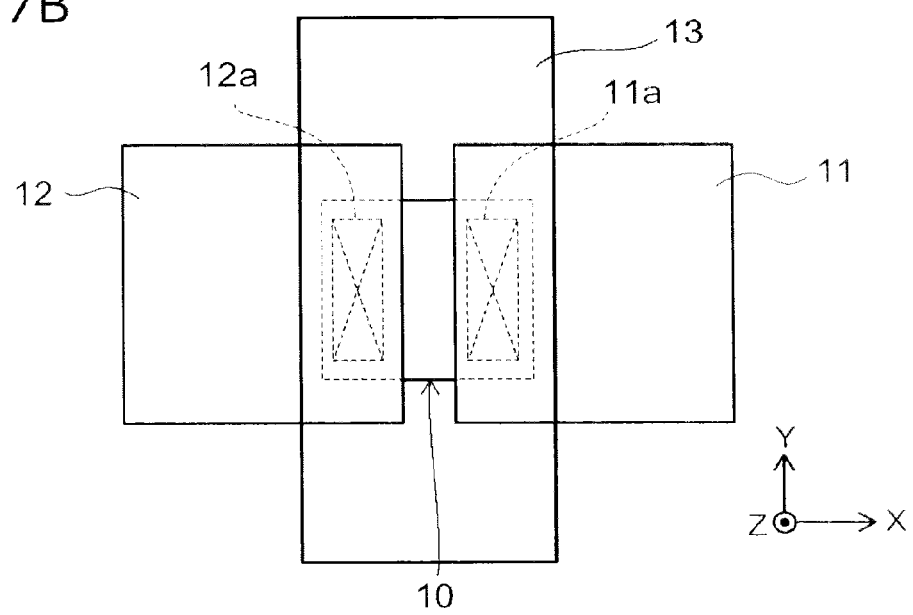

FIGS. 7A and 7B are schematic views showing an alternative semiconductor element according to the first embodiment.

FIG. 7A is a schematic sectional view of the semiconductor element 114. FIG. 7B is a schematic plan view of the semiconductor element 114.

As shown in FIGS. 7A and 7B, in the semiconductor element 114, the gate electrode 13 opposes the entirety of the semiconductor layer 10. In this example, the entirety of the semiconductor layer 10 overlaps the gate electrode 13 as projected on the X-Y plane. That is, in this example, the semiconductor layer 10 does not extend outside from the gate electrode 13.

Furthermore, in the semiconductor element 114, the entirety of the part 11a of the first conductive unit 11 overlaps the gate electrode 13 as projected on the X-Y plane. The entirety of the part 12a of the second conductive unit 12 overlaps the gate electrode 13 as projected on the X-Y plane. Thus, in the semiconductor element 114, for instance, electric field concentration on the taper part can be suppressed compared with the semiconductor element 110.

(Second Embodiment)

Figure 8:
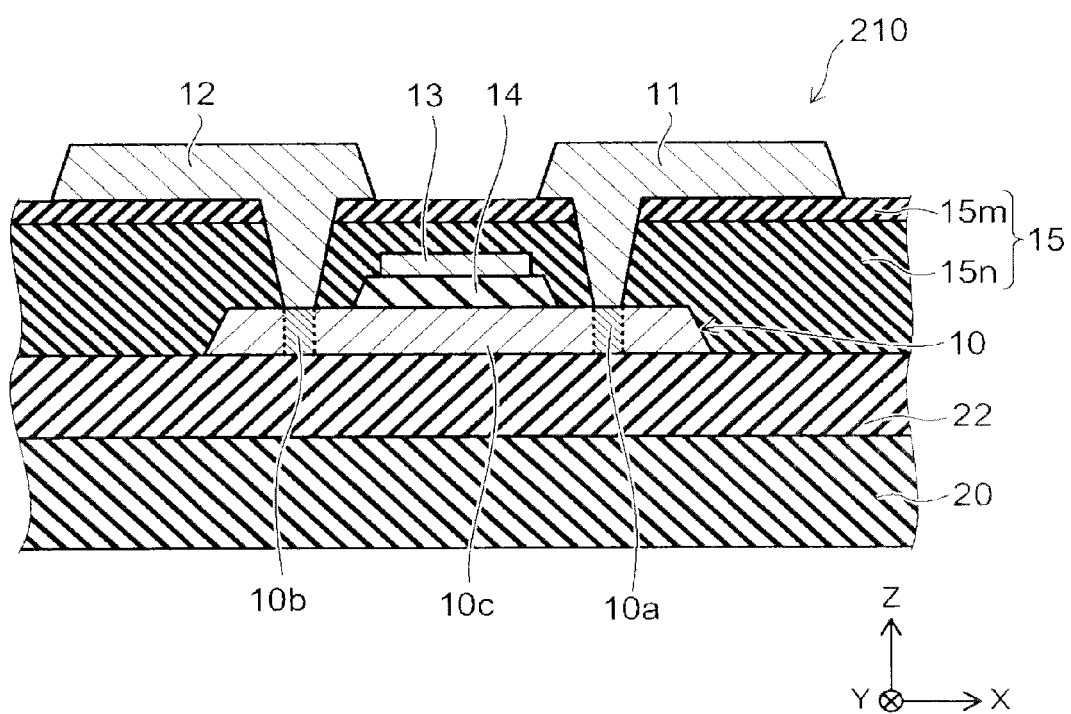
FIG. 8 is a sectional view schematically showing a semiconductor element according to a second embodiment.

FIG. 8 is a sectional view schematically showing a semiconductor element according to a second embodiment.

As shown in FIG. 8, in the semiconductor element 210, as in the above embodiment, the semiconductor layer 10 includes a first portion 10a, a second portion 10b arranged with the first portion 10a in the X-axis direction, and a third portion 10c provided between the first portion 10a and the second portion 10b. The semiconductor layer 10 includes an oxide semiconductor. The first conductive unit 11 is electrically connected to the first portion 10a. The second conductive unit 12 is separated from the first conductive unit 11 and electrically connected to the second portion 10b. The gate electrode 13 is separated from the first conductive unit 11 and the second conductive unit 12. The gate electrode 13 opposes the third portion 10c. The gate insulating film 14 is provided between the third portion 10c and the gate electrode 13. The concentration of nitrogen of the first portion 10a is higher than the concentration of nitrogen of the third portion 10c. The concentration of nitrogen of the second portion 10b is higher than the concentration of nitrogen of the third portion 10c.

As in the above embodiment, the semiconductor element 210 includes an interlayer insulating film 15. The interlayer insulating film 15 is provided between the semiconductor layer and the first conductive unit 11 and between the semiconductor layer 10 and the second conductive unit 12. The interlayer insulating film 15 includes a first region 15m and a second region 15n. The second region 15n is provided between the semiconductor layer 10 and the first region 15m. The concentration of nitrogen of the first region 15m is higher than the concentration of nitrogen of the second region 15n.

On the other hand, in the semiconductor element 210, the gate insulating film 14 is provided on the third portion 10c. The gate electrode 13 is provided on the gate insulating film 14. The first conductive unit 11 is provided on the first portion 10a. The second conductive unit 12 is provided on the second portion 10b.

That is, the semiconductor element 210 is a thin film transistor of what is called the top gate type. In the semiconductor element 210 of the top gate type, the concentration of nitrogen of the first portion 10a is made higher than the concentration of nitrogen of the third portion 10c, and the concentration of nitrogen of the second portion 10b is made higher than the concentration of nitrogen of the third portion 10c. Thus, also in the semiconductor element 210, as in the above embodiment, the reliability of the semiconductor element 210 can be improved.

Next, a method for manufacturing the semiconductor element 210 is described.

FIGS. 9A to 9G are sectional views schematically showing a sequential process for manufacturing a semiconductor element according to the second embodiment.

Here, the material of the members of the semiconductor element 210 and the specific formation method thereof that can be implemented similarly to the above semiconductor element 110 are not described in detail.

Figure 9A:
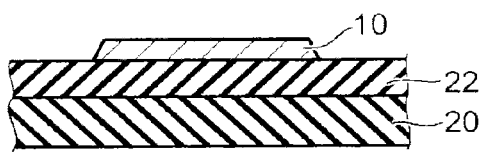
FIGS. 9A to 9G are sectional views schematically showing a sequential process for manufacturing a semiconductor element according to the second embodiment.

As shown in FIG. 9A, in the manufacturing of the semiconductor element 210, first, a barrier layer 22 is formed on a substrate 20, and a semiconductor layer 10 is formed on the barrier layer 22.

Figure 9E:
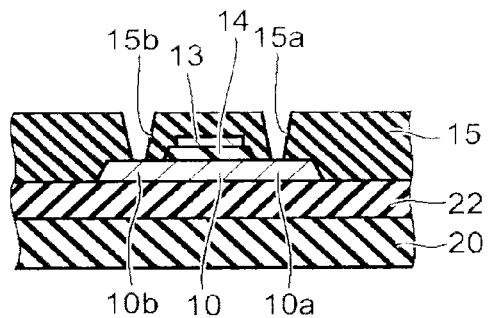
Figure 9B:
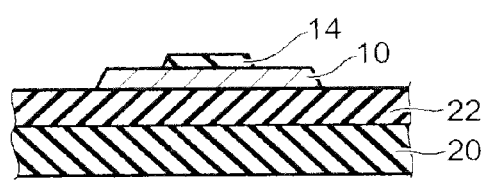

As shown in FIG. 9B, a gate insulating film 14 is formed on the third portion 10c of the semiconductor layer 10.

Figure 9C:
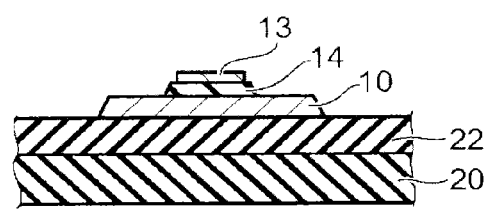

As shown in FIG. 9C, a gate electrode 13 is formed on the gate insulating film 14.

Figure 9F:
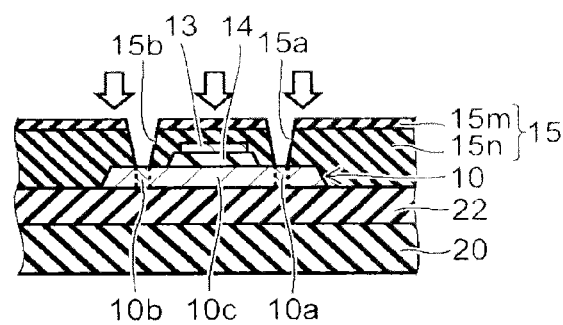
Figure 9D:
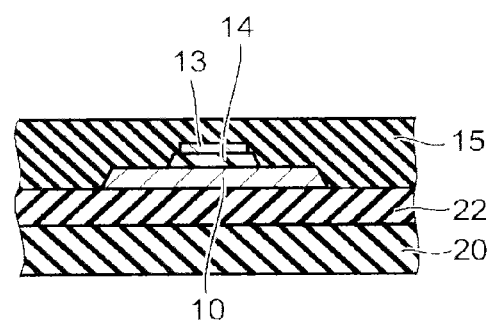

As shown in FIG. 9D, an interlayer insulating film 15 is formed on the barrier layer 22, on the semiconductor layer 10, on the gate insulating film 14, and on the gate electrode 13.

Next, heat treatment is performed in a clean oven or quartz furnace. The temperature of the heat treatment is e.g. 200-400° C., and preferably 350-400° C. The heat treatment is performed in an ambient and nitrogen atmosphere.

As shown in FIG. 9E, a first opening 15a and a second opening 15b are formed in the interlayer insulating film 15 by e.g. photolithography processing and etching processing. That is, at least part of the first portion 10a of the semiconductor layer 10 is exposed by the first opening 15a, and at least part of the second portion 10b of the semiconductor layer 10 is exposed by the second opening 15b.

As shown in FIG. 9F, nitrogen is implanted from above the interlayer insulating film 15. Thus, nitrogen is implanted into the first portion 10a of the semiconductor layer 10 in accordance with the shape of the first opening 15a. Nitrogen is implanted into the second portion 10b of the semiconductor layer 10 in accordance with the shape of the second opening 15*b*. Thus, the concentration of nitrogen of the first portion 10*a* and the concentration of nitrogen of the second portion 10*b* are made higher than the concentration of nitrogen of the third portion 10*c*.

Furthermore, nitrogen is implanted also into the upper portion of the interlayer insulating film 15. Thus, a first region 15*m* and a second region 15*n* are formed in the interlayer insulating film 15. The concentration of nitrogen of the first region 15*m* is made higher than the concentration of nitrogen of the second region 15*n*.

Figure 9G:
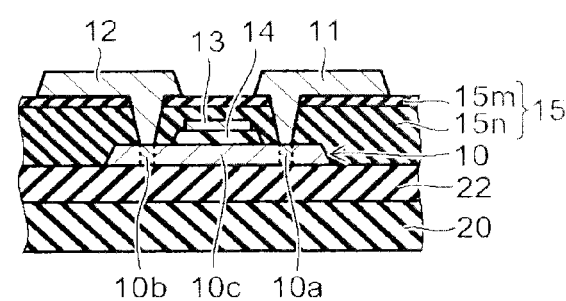

As shown in FIG. 9G, a first conductive unit 11 and a second conductive unit 12 constituting a source electrode and a drain electrode are formed on the interlayer insulating film 15.

Next, heat treatment is performed in a clean oven or quartz furnace. The temperature of the heat treatment is e.g. 200-400° C., and preferably 250-350° C. The heat treatment is performed in an ambient and nitrogen atmosphere.

Thus, the semiconductor element 210 is completed.

Figure 10:
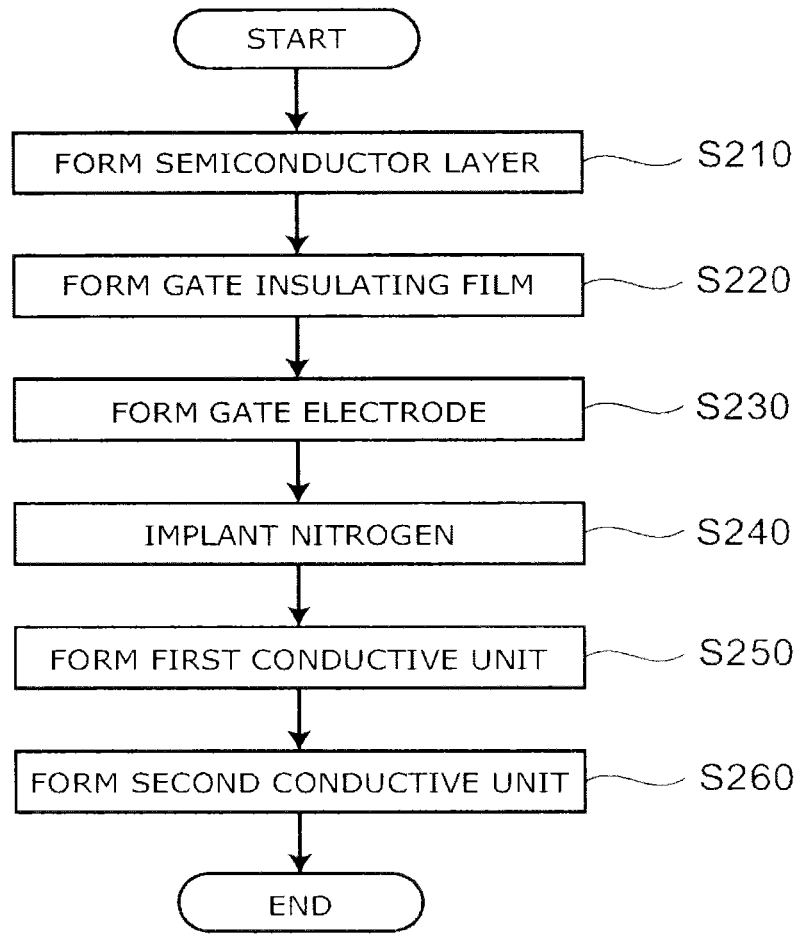
FIG. 10 is a flow chart schematically showing the method for manufacturing a semiconductor element according to the second embodiment.

FIG. 10 is a flow chart schematically showing the method for manufacturing a semiconductor element according to the second embodiment.

As shown in FIG. 10, the method for manufacturing a semiconductor element according to the embodiment includes a step S210 for forming a semiconductor layer 10, a step S220 for forming a gate insulating film 14, a step S230 for forming a gate electrode 13, a step S240 for implanting nitrogen, a step S250 for forming a first conductive unit 11, and a step S260 for forming a second conductive unit 12. The method for manufacturing a semiconductor element according to the embodiment may further include other steps. For instance, a step for forming an interlayer insulating film 15 may be provided between the step S230 and the step S240.

The step S210 performs e.g. the processing described with reference to FIG. 9A. The step S220 performs e.g. the processing described with reference to FIG. 9B. The step S230 performs e.g. the processing described with reference to FIG. 9C. The step S240 performs e.g. the processing described with reference to FIGS. 9D to 9F. The step S250 and the step S260 perform e.g. the processing described with reference to FIG. 9G.

Thus, a semiconductor element having high reliability can be manufactured.

(Third Embodiment)

Figure 11:
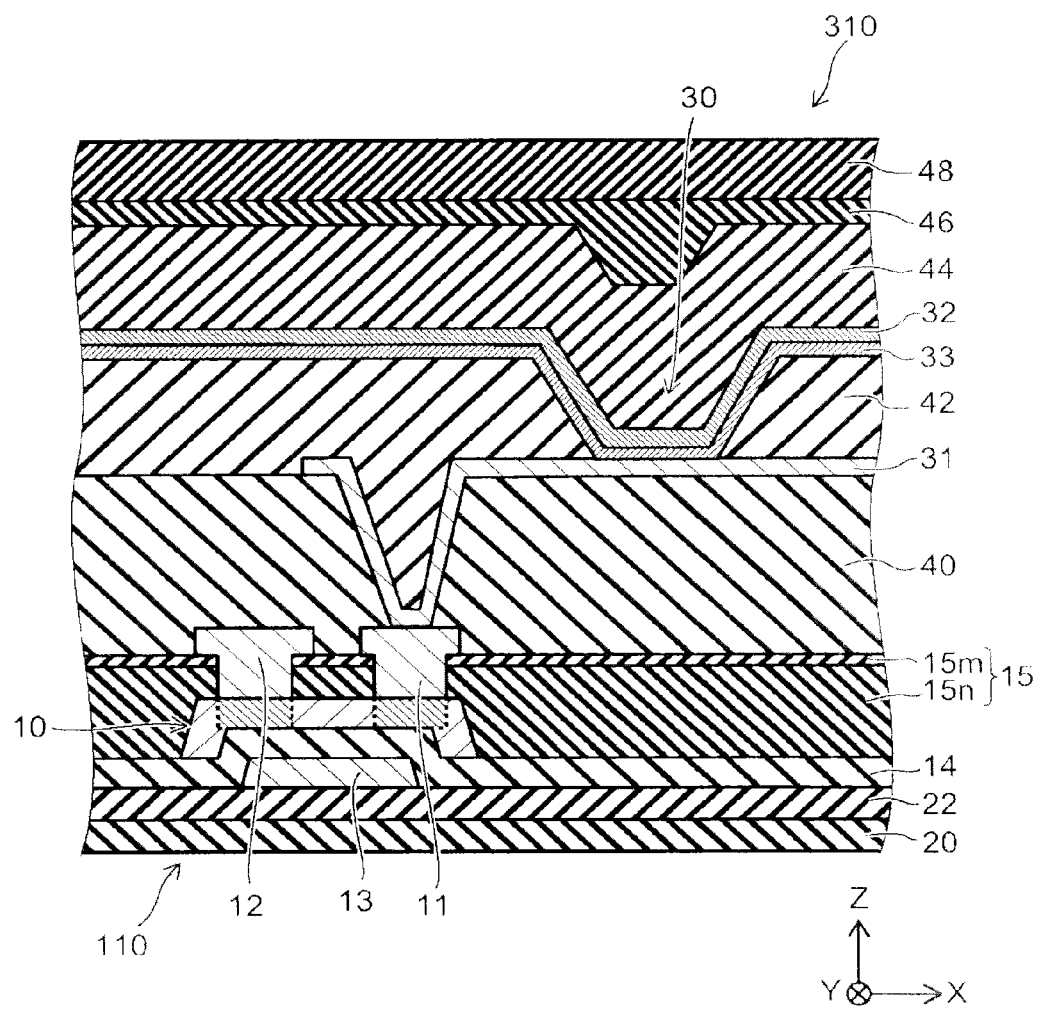
FIG. 11 is a sectional view schematically showing a display device according to a third embodiment.

FIG. 11 is a sectional view schematically showing a display device according to a third embodiment.

As shown in FIG. 11, the display device 310 includes a semiconductor element 110 and a pixel unit 30. In this example, the semiconductor element 110 is illustrated. However, the semiconductor element included in the display device 310 may be any of the semiconductor elements described in the above embodiments.

The pixel unit 30 includes a first electrode 31, a second electrode 32, and an organic light emitting layer 33. The first electrode 31 is electrically connected to the first conductive unit 11. The second electrode 32 opposes the first electrode 31. The second electrode 32 opposes the first electrode 31 in e.g. the Z-axis direction. The organic light emitting layer 33 is provided between the first electrode 31 and the second electrode 32. In the pixel unit 30, at least one of the first electrode 31 and the second electrode 32 has optical transmissivity. In this example, the first electrode 31 has optical transmissivity. In this example, light emitted from the organic light emitting layer 33 is transmitted through the first electrode 31 and emitted outside.

The display device 310 includes e.g. a plurality of semiconductor elements 110 and a plurality of pixel units 30. For instance, the plurality of semiconductor elements 110 are opposed respectively to the plurality of pixel units 30. For instance, emission of light from the pixel units 30 is controlled by the respective semiconductor elements 110. For instance, the pixel units 30 and the semiconductor elements 110 are combined and arranged in a matrix. In the display device 310, light emission of each of the pixel units 30 arranged in a two-dimensional matrix is controlled. Thus, an image can be displayed in the display device 310. That is, in this example, the display device 310 is an active matrix display device based on organic EL.

The driving scheme of the pixel units 30 is not limited to the active matrix scheme. For instance, the driving scheme may be the passive matrix scheme or other driving schemes. For instance, in the case of the passive matrix scheme, one semiconductor element 110 is provided for a plurality of pixel units 30 arranged in a line.

In this example, the display device 310 further includes a color filter 40, a bank layer 42, a sealing layer 44, a bonding layer 46, and a resin layer 48.

The color filter 40 is provided between the first electrode 31 and the interlayer insulating film 15. The color filter 40 has e.g. a different color for each pixel unit 30. The color filter 40 is made of e.g. a color resin film (e.g., color resist) of one of red, green, and blue. For instance, red, green, and blue color filters 40 are arranged in a prescribed pattern in the respective pixel units 30. The light emitted from the organic light emitting layer 33 is transmitted through the color filter 40 and emitted outside from the substrate 20 side. Thus, light of a color corresponding to the color filter 40 is emitted from each pixel unit 30. The color filter 40 is provided as necessary. The color filter 40 can be omitted.

The first electrode 31 is provided on the color filter 40. The first electrode 31 is made of e.g. a material having conductivity and optical transmissivity. The first electrode 31 is made of e.g. ITO (indium tin oxide).

The color filter 40 is provided with an opening for exposing part of the first conductive unit 11. Part of the first electrode 31 is inserted into the opening of the color filter 40. The first electrode 31 is electrically connected to the first conductive unit 11 in e.g. the portion exposed in the opening of the first conductive unit 11. The first electrode 31 is e.g. in contact with the portion exposed in the opening of the first conductive unit 11.

The bank layer 42 is provided on the first electrode 31 and the color filter 40. The bank layer 42 is made of e.g. a material having insulating property. The bank layer 42 is made of e.g. an organic resin material. The bank layer 42 is provided with an opening for exposing part of the first electrode 31. For instance, the opening of the bank layer 42 defines the region of each pixel unit 30.

The organic light emitting layer 33 is provided on the bank layer 42. The organic light emitting layer 33 is e.g. in contact with the first electrode 31 in the opening of the bank layer 42. The organic light emitting layer 33 is made of e.g. a stacked body in which a hole transport layer, a light emitting layer, and an electron transport layer are stacked. The organic light emitting layer 33 may be provided only in e.g. the portion in contact with the first electrode 31. That is, the organic light emitting layer 33 may be provided only in the opening of the bank layer 42.

The second electrode 32 is provided on the organic light emitting layer 33. The second electrode 32 is made of a material having conductivity. The second electrode 32 is made of e.g. Al.

The sealing layer 44 covers the organic light emitting layer 33 and the second electrode 32. The sealing layer 44 protects e.g. the organic light emitting layer 33 and the second electrode 32. The sealing layer 44 is made of e.g. at least one of silicon oxide film, silicon oxynitride film, silicon nitride film, alumina, and tantalum oxide film. The sealing layer 44 is made of e.g. a stacked film thereof.

The resin layer 48 is bonded onto the sealing layer 44 by the bonding layer 46. The resin layer 48 is made of e.g. polyimide.

In this example, the light emitted from the organic light emitting layer 33 is transmitted through the first electrode 31 and emitted outside from the substrate 20. That is, in this example, the display device 310 is of what is called the bottom emission type. Thus, in this example, for instance, the gate insulating film 14, the interlayer insulating film 15, the substrate 20, and the barrier layer 22 are each made of a material having optical transmissivity.

For instance, the first electrode 31 may be optically reflective, the second electrode 32 may be optically transmissive, and light may be emitted outside from the resin layer 48. That is, the display device 310 may be of what is called the top emission type. In this case, for instance, the sealing layer 44, the bonding layer 46, and the resin layer 48 are each made of a material having optical transmissivity.

Next, a method for manufacturing the display device 310 is described.

Figure 12A:
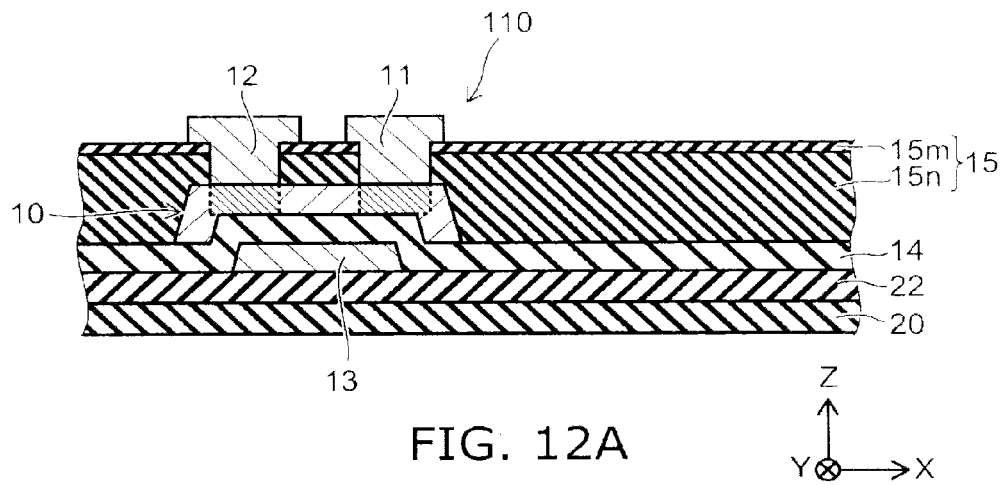
FIGS. 12A and 12B are sectional views schematically showing a sequential process for manufacturing a display device according to the third embodiment.
Figure 12B:
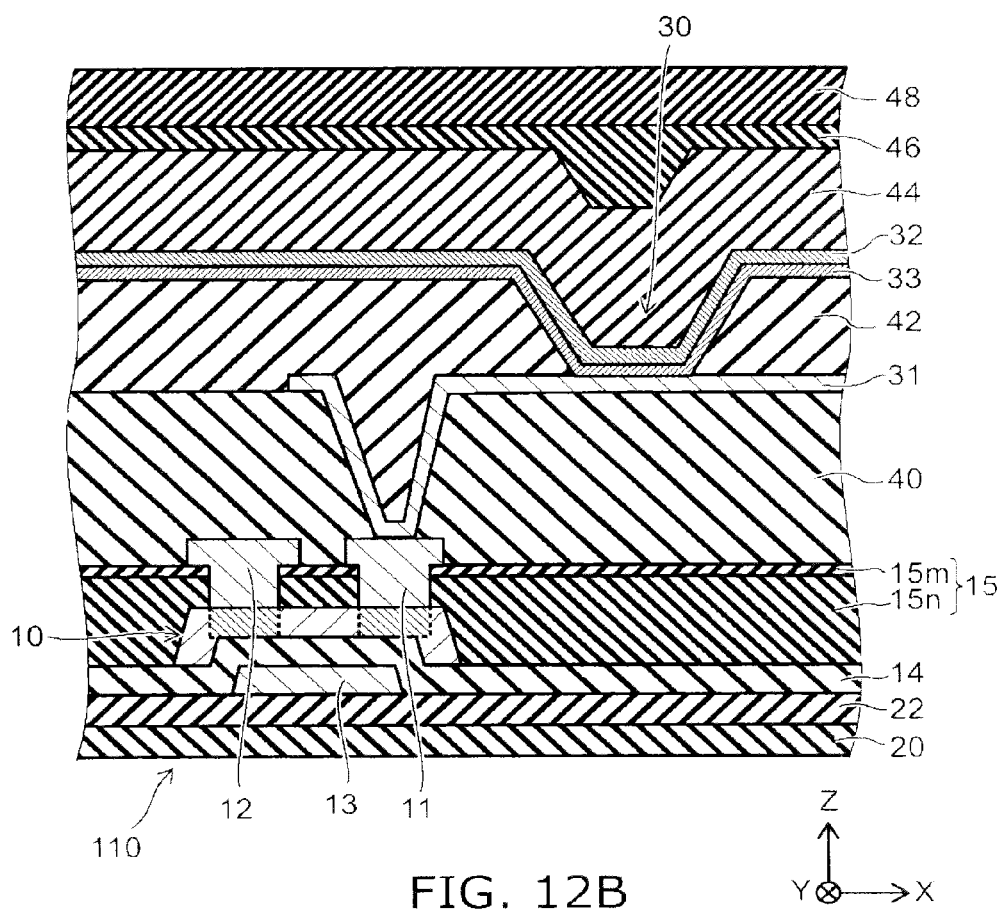

FIGS. 12A and 12B are sectional views schematically showing a sequential process for manufacturing a display device according to the third embodiment.

As shown in FIG. 12A, in the manufacturing of the display device 310, first, a semiconductor element 110 is formed on a substrate 20 by one of the manufacturing methods described in the above embodiments.

As shown in FIG. 12B, after forming the semiconductor element 110, a pixel unit 30 is formed on the substrate 20. For instance, a pixel unit 30 is formed on the interlayer insulating film 15 of the semiconductor element 110.

For instance, a color filter 40 is formed on the interlayer insulating film 15. An opening for exposing at least part of the first conductive unit 11 is formed in the color filter 40. A first electrode 31 is formed on the color filter 40. A bank layer 42 is formed on the first electrode 31 and the color filter 40. An opening for exposing part of the first electrode 31 is formed in the bank layer 42. An organic light emitting layer 33 is formed on the bank layer 42. A second electrode 32 is formed on the organic light emitting layer 33. A sealing layer 44 is formed on the second electrode 32. A resin layer 48 is bonded onto the sealing layer 44 via a bonding layer 46.

Thus, the display device 310 is completed.

Figure 13:
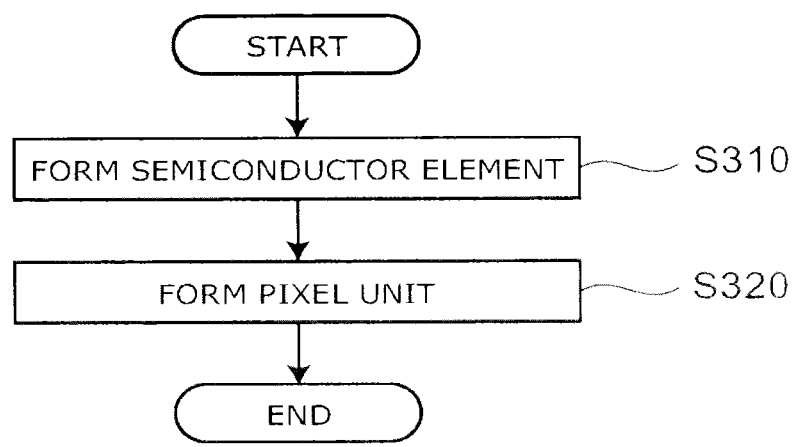
FIG. 13 is a flow chart schematically showing a method for manufacturing a display device according to the third embodiment.

FIG. 13 is a flow chart schematically showing a method for manufacturing a display device according to the third embodiment.

As shown in FIG. 13, the method for manufacturing a display device according to the embodiment includes a step S310 for forming a semiconductor element 110 and a step S320 for forming a pixel unit 30. The step S310 can be based on e.g. the method described with reference to FIG. 5 or 10.

The step S310 performs e.g. the processing described with reference to FIG. 12A. The step S320 performs e.g. the processing described with reference to FIG. 12B.

Thus, a display device having high reliability can be manufactured.

The embodiments provide a semiconductor element, a display device, a method for manufacturing a semiconductor element, and a method for manufacturing a display device having high reliability.

In this specification, "perpendicular" and "parallel" mean not only being exactly perpendicular and exactly parallel, but include e.g. variations in the manufacturing process, and only need to mean being substantially perpendicular and substantially parallel. In this specification, the state of being "provided on" includes not only the state of being provided in direct contact, but also the state of being provided with another element interposed in between. The state of being "stacked" includes not only the state of being stacked in contact with each other, but also the state of being stacked with another element interposed in between. The state of being "opposed" includes not only the state of directly facing, but also facing with another element interposed in between. In this specification, "electrically connected" includes not only the case of being connected by direct contact, but also the case of being connected via another conductive member and the like.

The embodiments of the invention have been described above with reference to examples.

However, the embodiments of the invention are not limited to these examples. For instance, any specific configurations of various components such as the semiconductor layer, first conductive unit, second conductive unit, gate electrode, gate insulating film, interlayer insulating film, pixel unit, first electrode, second electrode, and organic light emitting layer included in the semiconductor element and the display device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Those skilled in the art can appropriately modify and practice the semiconductor element, the display device, the method for manufacturing a semiconductor element, and the method for manufacturing a display device having high reliability described above as the embodiments of the invention. All such semiconductor elements, display devices, methods for manufacturing a semiconductor element, and methods for manufacturing a display device having high reliability are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor element comprising:
   a semiconductor layer g a first portion, a second portion arranged with the first portion in a first direction, a third portion provided between the first portion and the second portion, and a fourth portion, the semiconductor layer including an oxide semiconductor;

a first conductive unit electrically connected to the first portion;

a second conductive unit separated from the first conductive unit and electrically connected to the second portion;

a gate electrode separated from the first conductive unit, the second conductive unit, and the third portion, the gate electrode opposing the third portion; and a gate insulating film provided between the third portion and the gate electrode, a concentration of nitrogen of the first portion being higher than a concentration of nitrogen of the third portion, a concentration of nitrogen of the second portion being higher than the concentration of nitrogen of the third portion, the first portion being on top of the fourth portion, and the concentration of nitrogen of the first portion being higher than a concentration of nitrogen of the fourth portion.

2. The element according to claim 1, wherein the first portion is provided to extend along a second direction perpendicular to the first direction, and the second portion is provided to extend along the second direction.

3. The element according o claim 1, wherein the semiconductor layer further includes a fifth portion, the second portion is provided between the second conductive unit and the fifth portion, and the concentration of nitrogen of the second portion is higher than a concentration of nitrogen of the fifth portion.

4. The element according to claim 1, further comprising:

an interlayer insulating film provided between the semiconductor layer and the first conductive unit and between the semiconductor layer and the second conductive unit, the interlayer insulating film including a first opening exposing at least a part of the first portion and a second opening exposing at least a part of the second portion, the first conductive unit being electrically connected to at least the part of the first portion exposed by the first opening, and the second conductive unit being electrically connected to at least the part of the second portion exposed by the second opening.

5. The element according to claim 4, wherein the interlayer insulating film includes a first region and a second region, the second region being provided between the semiconductor layer and the first region, and a concentration of nitrogen of the first region is higher than a concentration of nitrogen of the second region.

6. The element according to claim 1, wherein the gate insulating film is provided on the gate electrode, the semiconductor layer is provided on the gate insulating film, the first conductive unit is provided on the first portion, and the second conductive unit is provided on the second portion.

7. The element according to claim 6, wherein the gate electrode opposes the entirety of the semiconductor layer.

8. The element according to claim 1, wherein the gate insulating film is provided on the third portion, the gate electrode is provided on the gate insulating film, the first conductive unit is provided on the first portion, and the second conductive unit is provided on the second portion.

9. The element according to claim 1, wherein the oxide semiconductor includes at least one of indium, gallium, zinc, and tin.

10. The element according to claim 1, wherein:

a composition ratio of nitrogen in the first portion is more than 0 atomic % and 3 atomic % or less, and a composition ratio of nitrogen in the second portion is more than 0 atomic % and 3 atomic % or less.

11. The element according to claim 1, wherein a resistivity of the first portion is higher than a resistivity of the third portion, and a resistivity of the second portion is higher than the resistivity of the third portion.

12. The element according to claim 11, wherein the resistivity of the first portion is 10 $\Omega$·cm or more and $10^8$ $\Omega$·cm or less, the resistivity of the second portion is 10 $\Omega$·cm or more and $10^8$ $\Omega$·cm or less, and the resistivity of the third portion is $10^{-4}$ $\Omega$·cm or more and 100 $\Omega$·cm or less.

13. The element according to claim 3, wherein a thickness of the second portion is more than 0 and 5 nm or less.

14. A display device comprising:

a semiconductor element including:

a semiconductor layer including a first portion, a second portion arranged with the first portion in a first direction, a third portion provided between the first portion and the second portion, and a fourth portion, the semiconductor layer including an oxide semiconductor;

a first conductive unit electrically connected to the first portion;

a second conductive unit separated from the first conductive unit and electrically connected to the second portion;

a gate electrode separated from the first conductive unit, the second conductive unit, and the third portion, the gate electrode opposing the third portion; and a gate insulating film provided between the third portion and the gate electrode, a concentration of nitrogen of the first portion being higher than a concentration of nitrogen of the third portion, and a concentration of nitrogen of the second portion being higher than the concentration of nitrogen of the third portion; and a pixel unit including a first electrode electrically connected to the first conductive unit, a second electrode opposing the first electrode, and an organic light emitting layer provided between the first electrode and the second electrode, at least one of the first electrode and the second electrode having optical transmissivity, the first portion being provided on top of the fourth portion, and the concentration of nitrogen of the first portion being higher than a concentration of nitrogen of the fourth portion.

15. The element according to claim 1, wherein a thickness of the first portion is more than 0 and 5 nm or less.

16. The device according to claim 14, wherein a resistivity of the first portion is higher than a resistivity of the third portion, and a resistivity of the second portion is higher than the resistivity of the third portion.

17. The device according to claim 16, wherein
the resistivity of the first portion is 10 Ω·cm or more and $10^8$ Ω·cm or less,
the resistivity of the second portion is 10 Ω·cm or more and $10^8$ Ω·cm or less, and
the resistivity of the third portion is $10^{-4}$ Ω·cm or more and 100 Ω·cm or less.

* * * * *